(12) United States Patent
Maulini et al.

(10) Patent No.: US 9,077,153 B2
(45) Date of Patent: Jul. 7, 2015

(54) TAPERED WAVEGUIDE HIGH-POWER QUANTUM CASCADE LASERS

(71) Applicant: Pranalytica, Inc., Santa Monica, CA (US)

(72) Inventors: Richard Maulini, Los Angeles, CA (US); Arkadiy Lyakh, Santa Monica, CA (US); Alexei Tsekoun, Los Angeles, CA (US); C. Kumar N. Patel, Santa Monica, CA (US)

(*) Notice: Subject to any disclaimer, the term of this patent is extended or adjusted under 35 U.S.C. 154(b) by 130 days.

(21) Appl. No.: 13/728,854

(22) Filed: Dec. 27, 2012

(65) Prior Publication Data

US 2015/0103857 A1    Apr. 16, 2015

Related U.S. Application Data

(60) Provisional application No. 61/580,385, filed on Dec. 27, 2011.

(51) Int. Cl.
| | | |
|---|---|---|
| H01S 5/20 | (2006.01) | |
| H01S 5/34 | (2006.01) | |
| H01S 5/24 | (2006.01) | |
| H01S 5/30 | (2006.01) | |

(52) U.S. Cl.
CPC .......... H01S 5/3401 (2013.01); H01S 5/24 (2013.01); H01S 5/30 (2013.01)

(58) Field of Classification Search
CPC ............. H01S 5/20; H01S 5/22; H01S 5/30; H01S 5/24
See application file for complete search history.

(56) References Cited

U.S. PATENT DOCUMENTS 6,895,152 B2 * 5/2005 Sumida et al. ............... 385/123

OTHER PUBLICATIONS

Mariano Troccoli et al.; Mid-infrared quantum cascade laser ampti-fier for high power single-mode emission and improved beam quatity, Appl. Phys. Lett. 80, 4103, 2002.
Stefan Menzel, et al., Quantum cascade laser master-oscillator power-amplifier with 1.5 W output power at 300 K, Optics Express, 19, 16229, 2011.
Lars Nahle, et al., Tapered quantum cascade lasers, Appl. Phys. Lett. 91, 181122, 2007.
W. Zhang, et al., Small divergence singlemode emitting tapered distributed-feedback quantum cascade lasers, Electron, Lett. 46, 528, 2010.
Francois Ladouceur and John D. Love, Silica-based buried channel waveguides and devices, Chapman & Hall, London, 1996, Chap. 14, pp. 177-191.

* cited by examiner

*Primary Examiner* — Jae Lee
(74) *Attorney, Agent, or Firm* — Cislo & Thomas, LLP

(57) ABSTRACT

An improved quantum cascade laser, the improvement comprising a longitudinally non-uniform dielectric waveguide. The waveguide includes a longitudinally straight section and a longitudinally tapered section. The length of the tapered section is between 5% and 50% of the total cavity length. The tapered section tapers at a taper angle from the facet width to the ridge width. The taper angle is smaller than the delineation angle of the waveguide.

3 Claims, 5 Drawing Sheets

TAPERED WAVEGUIDE HIGH-POWER QUANTUM CASCADE LASERS

CROSS-REFERENCES TO RELATED APPLICATIONS

This patent application claims priority to provisional Application No. 61/580,385 filed Dec. 27, 2011 and entitled "Tapered Waveguide High Power Quantum Cascade Lasers." That application is incorporated here by this reference.

TECHNICAL FIELD

This invention relates to quantum cascade lasers, particularly to high-power mid-infrared quantum cascade semiconductor lasers.

BACKGROUND ART

Quantum cascade lasers (QCLs) are important semiconductor lasers, operating at room temperature, in the mid-infrared spectral range, from 3.5 to 20 microns, in terms of output power and wallplug efficiency. Wallplug efficiencies in excess of 20% have been demonstrated in the past few years, and devices producing multi-watt continuous-wave output power are now commercially available. As with any other kind of high-power edge-emitting semiconductor lasers, including diode lasers, one of the factors limiting the output power and reliability of QCLs is optical damage of laser facets, which has, for a long time, been the main roadblock, limiting the output power of commercially-available fully-packaged continuous-wave room-temperature QCLs to about 2 W for a reliability of >3000 hours.

The active region of a mid-infrared quantum cascade laser, which also constitutes the core of its dielectric waveguide, is typically about 5-15 µm wide and about 1-2 µm thick. The optical mode is therefore confined to an area, A, on the order of $10^{-6}$-$10^{-7}$ cm$^2$. The optical power density, or optical intensity, $I=P/A$, where P is the power travelling in the waveguide, increases as a function of the output power $P_{out}$. Because of the very small mode size, the optical intensity reaches very large values for high power QCLs. The output, or front, facet is more susceptible to optical damage than any other part of the device because, in the standard configuration with a high-reflectivity (HR) coated back facet and an anti-reflective (AR) coated front facet, the front facet is where the optical intensity is the highest. As an example, for a buried-heterostructure QCL with an active region width of 10 µm emitting 3 W of output power at a wavelength of 4.6 µm, the optical power density at the front facet is higher than 10 MW/cm$^2$. In addition, the front facet is typically coated with a dielectric AR coating, which has a relatively low thermal conductivity, unlike the back facet whose HR coating typically contains a metallic layer, which enhances its thermal conductivity. However, optically-induced damage to the rear (HR-coated) facet is also possible.

The maximum attainable optical power before facet damage, $P_{max}$, can be increased in at least two ways. One can improve the optical damage threshold power density by improved AR and/or HR coating design and/or deposition process to minimize optical absorption in the coating layers and/or enhance heat removal, or one can reduce the optical power density by increasing the output facet area. The most straightforward way to reduce optical intensity, I, at the facets at constant output power level is to utilize wider longitudinally uniform, or straight, devices. However, this approach has two major drawbacks. First, wider devices support a larger number of transverse optical modes and, therefore, have lower beam quality. Second, wider devices generate more heat per unit length, which results in a higher active region temperature and, hence, lower performance in high-duty-cycle and continuous-wave operation.

DISCLOSURE OF INVENTION

Therefore, a goal of this invention is to increase the output power of high-duty-cycle and continuous-wave quantum cascade lasers by decreasing the optical power intensity at the output facet (and, optionally, at the back facet, too) by resorting to longitudinally non-uniform waveguides consisting of a long and narrow straight section and a short tapered section near the facets (see FIG. 1). The narrow straight section is designed to select a desired transverse mode, or combination of transverse modes, and to minimize self-heating. For high beam quality, we typically select the straight section width to support only the $0^{th}$ order transverse mode. The tapered section is designed to expand the optical mode in the transverse direction, thereby decreasing optical intensity without sacrificing total output power and minimizing the active region self-heating near the output facet.

Tapered waveguides have previously been used in the design of QCLs, to realize master oscillator power amplifier (MOPA) devices (see [Ref. 1] and [Ref. 2]) and high-peak-power, high-beam-quality pulsed devices (see [Ref. 3] and [Ref. 4]). However, the motivations to use tapered waveguides in these applications were different from ours, and the resulting waveguide geometries were different as well.

The first of these previous applications was different from ours because the taper was not part of the laser oscillator but it was only used as a monolithically integrated single-pass external optical amplifier, that is, a device through which the light emitted by the laser oscillator, a distributed feedback QCL, travels only once before leaving the device.

In the second of the previous applications, the taper was part of the laser cavity as in our application. However, the motivation for tapering the waveguide in this application was also very different from ours. Specifically, in Reference 3 and Reference 4 the main purpose of the taper was to increase the device area to increase its peak power in low-duty-cycle pulsed operation while maintaining a good beam quality. In such devices, the length of the tapered section was typically more than half of the entire length of the device, and its area typically constituted most of the area of the entire device. Since self-heating is not significant in low-duty-cycle pulsed operation, the output facet width was typically 50-200 µm. While adequate for those low-duty-cycle operating conditions, such large waveguide widths are not compatible with high-duty-cycle and CW operation because of the high active region self-heating resulting from the significant waste heat generated in QCLs.

In our invention, on the other hand, the purpose of the taper is to reduce optical intensity at the output and back facets, while keeping self-heating to a minimum for high-performance CW operation. Therefore the taper width and length are kept to a minimum. As a result, the taper length is a small fraction of the length of the entire device and the taper area is a small fraction of the entire device area.

Accordingly, one aspect of the invention can be described as an improved InP-based, buried-heterostructure quantum cascade laser, where the improvement comprises a longitudinally non-uniform dielectric waveguide. The dielectric waveguide includes a longitudinally straight section and a longitudinally tapered section. The length of the tapered section is between 5% and 50% of the total cavity length (the length of the straight section plus the length of the tapered section).

The longitudinally straight section has a first end, a second end, a ridge width, and a length. The tapered section has a first end and a second end, and the first end of the tapered section is connected to the second end of the straight section. The tapered section tapers at a taper angle from a facet width of the tapered section at the second end of the tapered section to the ridge width at the first end of the tapered section.

BEST MODE FOR CARRYING OUT THE INVENTION

The detailed description set forth below in connection with the appended drawings is intended as a description of presently-preferred embodiments of the invention and is not intended to represent the only forms in which the present invention may be constructed or utilized. The description sets forth the functions and the sequence of steps for constructing and operating the invention in connection with the illustrated embodiments. However, it is to be understood that the same or equivalent functions and sequences may be accomplished by different embodiments that are also intended to be encompassed within the spirit and scope of the invention.

We designed, fabricated, and characterized high-power continuous-wave QCLs emitting at 4.7 μm relying on the concept that the taper length should be equal to a small fraction of the length of the entire device and the taper area to a small fraction of the entire device area.

The radiation loss in a tapered dielectric waveguide of rectangular cross section (see [Ref. 5]) becomes significant for angles larger or equal to the so-called "delineation angle" $\Omega_d$ given by:

$$\Omega_d = \frac{\sqrt{wt}}{4\lambda} \frac{n_{eff}^2 - n_{clad}^2}{n_{core}} \quad (1)$$

where w and t are the width and thickness of the waveguide core, respectively, λ is the wavelength of the radiation, $n_{core}$ and $n_{clad}$ are the core and cladding refractive indices, and $n_{eff}$ is the effective refractive index of the waveguide mode under consideration. For InP-based buried-heterostructure QCLs emitting at 4.7 μm, we find that $\Omega_d=2.7°$ for w=15 μm. Based on this result, we chose to use a taper angle $\Omega_T=0.7°$, which is smaller than $\Omega_d$, in our design.

Figure 1:
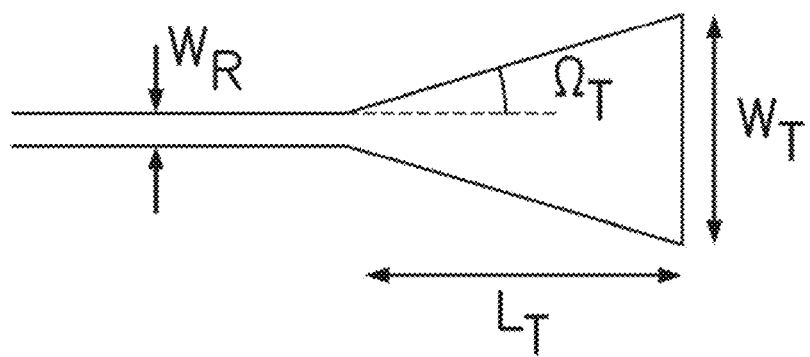
FIG. 1 is a schematic representation of a tapered waveguide QCL in an embodiment of the invention showing taper geometry at one facet.

The relevant tapered waveguide design parameters are illustrated in FIG. 1 and the corresponding values that we used in our experimental demonstration are given in Table 1. Our devices, which emit at a wavelength of 4.7 μm, have a total cavity length of 10 mm and a straight-section ridge width $W_R$ of 7.5 μm. $W_R$ was chosen so that the laser operates predominately in its 0th order transverse mode. The value of $W_R$ would be scaled for QCLs emitting at other wavelengths. The output facet width $W_T$ was chosen to be 20 μm, to reduce the power density and thus increase the damage threshold by a factor of ~2.5 compared to straight devices of same width $W_R$, while keeping the self-heating at the facet location to a minimum. The taper length $L_T$ was chosen to be 0.5 mm, so that the taper angle $\Omega_T$ is equal to 0.7° and, thus, no significant radiation loss is expected in the tapered section, as mentioned above.

Even though it is not as important to reduce the optical intensity at the back facet, because the power incident on it is much lower than on the front facet, we used the same taper geometry there as well, so that our devices do not have a preferable orientation, which simplifies the manufacturing process.

The resulting length of the straight section is 9 mm. Therefore, the total length of the tapered sections (0.5 mm+0.5 mm) is only 10% of the overall device length in our approach, or the minimum required for a meaningful reduction of optical power density at the facets while maintaining single spatial mode emission, and at the same time keeping active region area (and thus self-heating) increase to a minimum. We contrast this again with Reference 3 and Reference 4, where the tapered sections comprised more than half of the device length. According to our invention, the taper length should be less than 25% of the total length of the device to maintain a fundamental $TM_{00}$ transverse mode, minimize the self-heating and simultaneously achieve high power outputs without facet damage. Table 1 summarizes typical dimensions of the preferred embodiment of our invention.

TABLE 1

Preferred dimensions of the straight and tapered sections of our tapered-waveguide QCLs.

| Dimension: | Value: |
|---|---|
| Ridge width ($W_R$) | 7.5 μm |
| Facet width ($W_T$) | 20 μm |
| Taper length ($L_T$) | 0.5 mm |
| Taper angle ($\Omega_T$) | 0.7° |

Table 2 provides a set of preferred dimensions of the tapered region for optimum performance of the high power QCLs.

TABLE 2

Specification of preferred maximum and minimum taper length and taper areas.

| Parameter: | Maximum: | Minimum: |
|---|---|---|
| Taper length (total for both front and rear facets) as a fraction of the total length of the QCL | 50% | 5% |
| Taper area (total for both front and rear facets) as a fraction of the total active area of the QCL | 50% | 5% |

Figure 2:
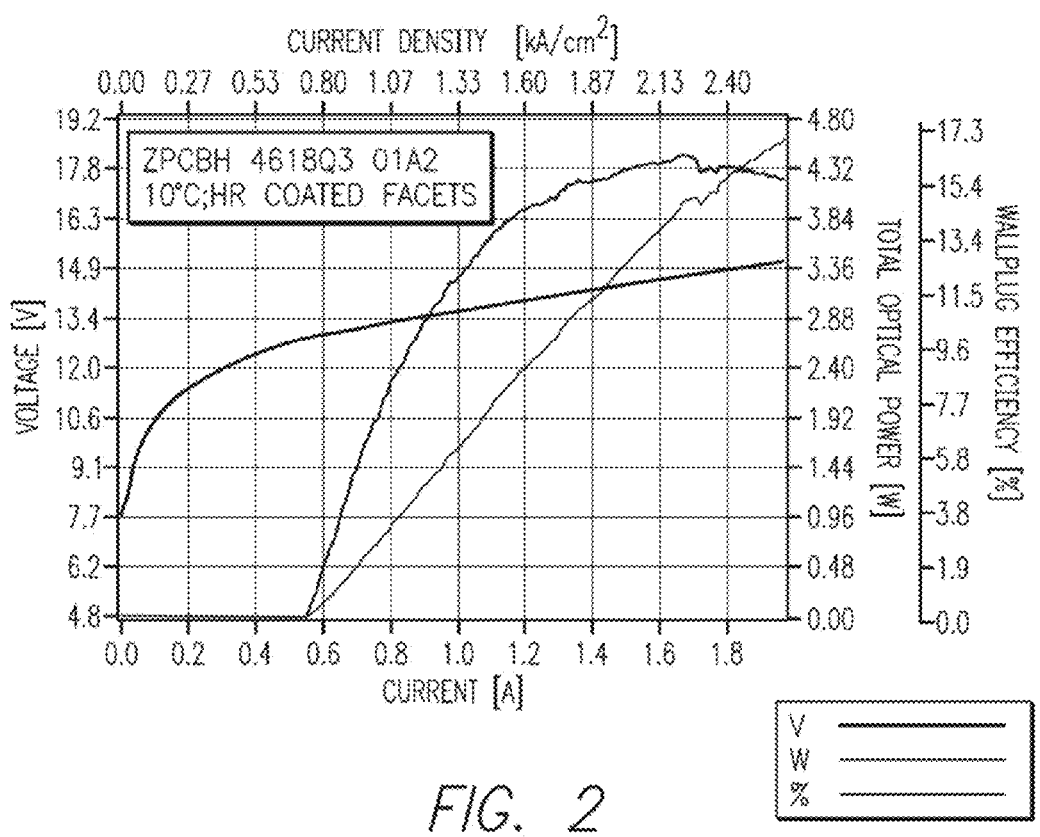
FIG. 2 shows voltage, optical power, and wallplug efficiency as function of injection current of a 10 mm-long, 7.5 μm-wide tapered QCL according to an embodiment of the invention, with a 20 μm-wide output facet in continuous-wave mode at 10° C. The maximum measured output power is >4.5 W.

The measured voltage, single-facet output power, and wallplug efficiency as function of injection current of a 10 mm-long, 7.5 mm-wide tapered QCL operated in continuous-wave mode at a temperature of 10° C. are shown in FIG. 2. The maximum measured output power is higher than 4.5 W at chip level, and the maximum electrical-to-optical power conversion efficiency, or wallplug efficiency, is equal to 16.3%. These are the highest continuous-wave output power and wallplug efficiency reported at this wavelength. At package level, the maximum output power is 4.2 W and the maximum wallplug efficiency is 14.2%. The difference between chip and package level power and wallplug efficiency comes from the non-ideal collection efficiency of the collimating optics. It is interesting to note that the maximum package-level wallplug efficiency is reached at an output power of 3.5 W. At 3 W output power level, the thermoelectric cooler consumption is only 8 W on an air-cooled heatsink. This results in an overall laser system efficiency, including the electrical power consumption of the thermoelectric cooler, of over 10%.

Figure 3:
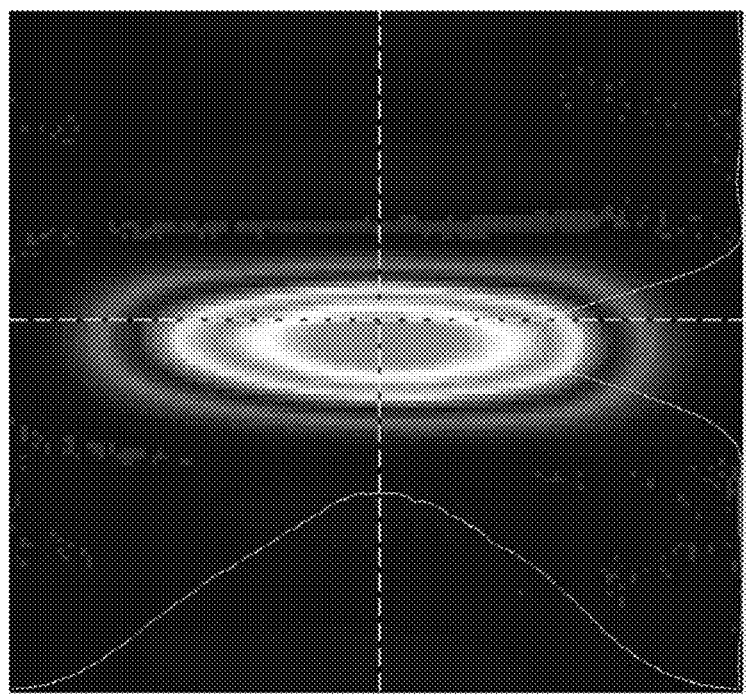
FIG. 3 is a beam picture of a tapered waveguide near its maximum output power point. The beam was collimated with an aspherical ZnSe lens, internal to the hermetically sealed butterfly package containing the QCL and its TEC (thermoelectric cooler). The photograph was taken 2 m away from the laser using a pyroelectric camera. Beam propagation factors $M^2<1.5$ were measured for both axes.

FIG. 3 shows a photograph of the output beam from the high-continuous-wave-power tapered-waveguide QCL operating close to its maximum power. The beam is single-lobed, i.e. consists of a $0^{th}$ order mode, along the two axes, with a ratio of the two diameters equal to about 3. While this strong ellipticity is not desirable for most applications, it can be easily be corrected by circularizing optics. The fact that the beam is purely $TM_{00}$ shows that the 7.5 μm-wide, 9 mm-long straight section of the waveguide is sufficient to prevent higher-order transverse modes from lasing, even though facet reflectivity is higher for these modes in TM polarization. We measured the beam propagation factor, $M^2$, along both axes using a pyroelectric camera and found values <1.5 for both axes.

Figure 4:
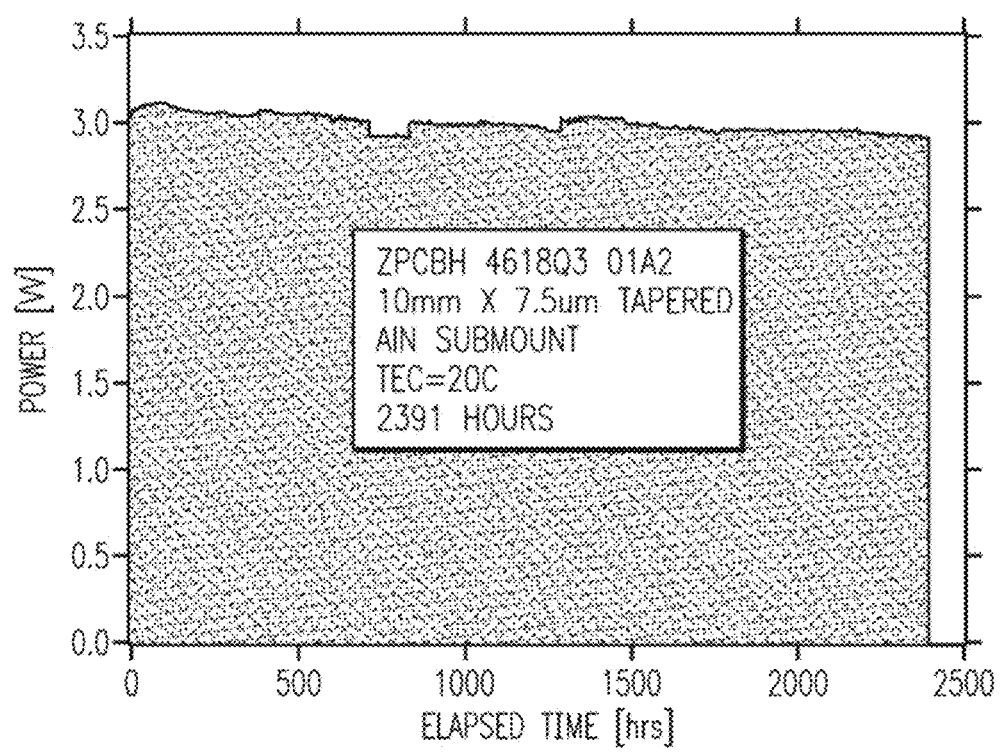
FIG. 4 shows the results of reliability testing of a high-power QCL according to an embodiment of the invention, emitting ~3 W of CW output power at a wavelength of 4.7 μm. Laser performance degraded by less than 5% after ~2400 hours of operation.

We characterized the long-term reliability of high-power tapered-waveguide QCLs. A packaged QCL with ~3 W CW output power at system level was mounted in our commercial QCL system and operated in CW mode, with 3 minute-long turn-off every hour to increase thermal stress. The measured output power versus operation time recorded during this experiment is shown in FIG. 4. After ~2400 hours of operation, the power decreased by less than 5%. This result is of great value for practical applications. One of the main applications of high power QCLs emitting in this wavelength region, directional infrared countermeasures, requires a device lifetime of at least 3000 hours, which we have almost already achieved at an output power of 3 W with our first generation of tapered waveguides.

In conclusion, our experimental results demonstrate that use of tapered waveguides is a very effective approach to increase the optical power output in CW operation without concurrent optical damage to the output facet of high power QCLs, while maintaining a good beam quality.

Figure 5:
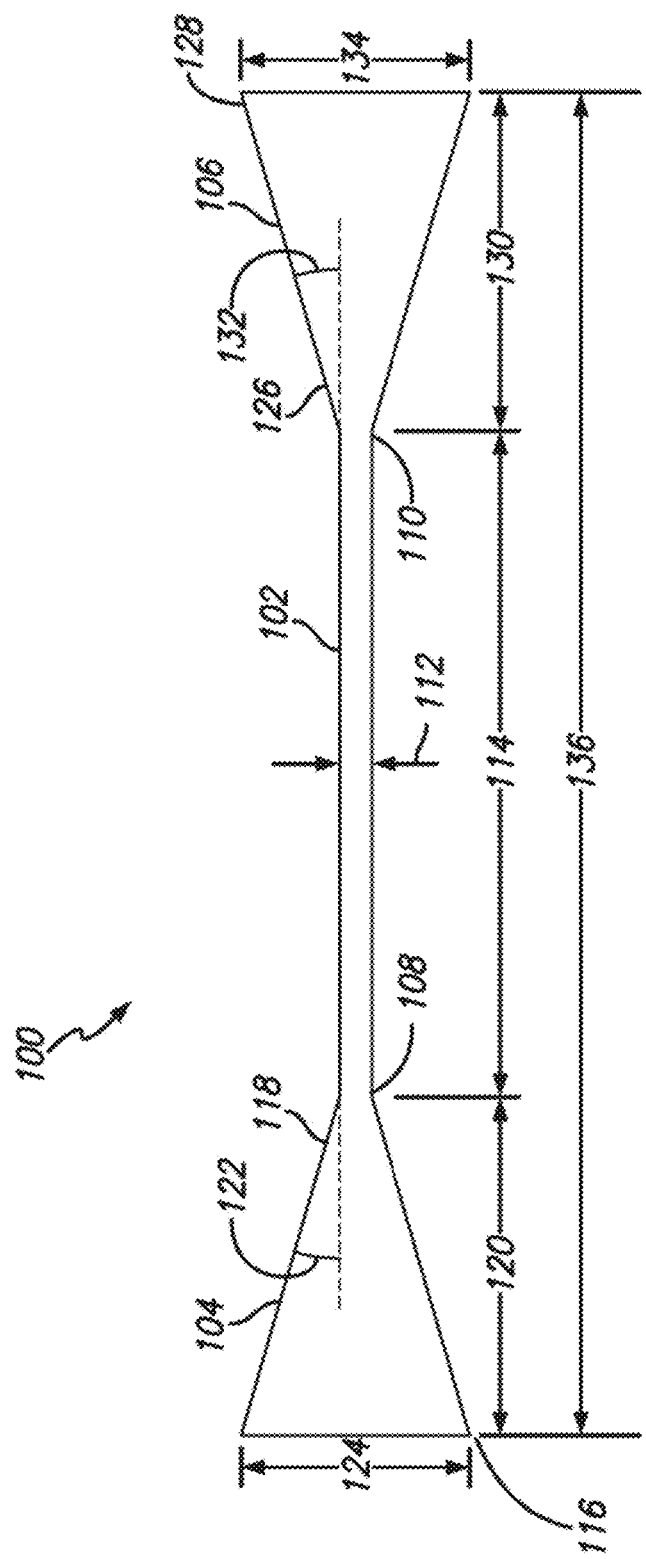
FIG. 5 is a schematic representation of a tapered waveguide QCL in an embodiment of the invention showing taper geometry at both the front facet and the back facet.

As such, an embodiment of the invention can be described as an improved InP-based, buried-heterostructure quantum cascade laser, the improvement being a longitudinally non-uniform dielectric waveguide 100. By reference to the attached figures (particularly FIG. 5), the dielectric waveguide 100 includes a longitudinally straight section 102, a first tapered section 104, and a second tapered section 106.

The straight section has a first end 108, a second end 110, a ridge width 112, and a length 114. Preferably, the ridge width 112 is around 7.5 μm at a wavelength of 4.7 μm. For QCLs emitting at other wavelengths, the ridge width is preferably scaled according to wavelength. The length 114 is preferably around 9 mm.

The first tapered section 104 has a first end 116 and a second end 118. The second end 118 of the first tapered section 104 is connected to the first end 108 of the straight section 102. The first tapered section 104 has a length 120, and the length 120 of the first tapered section 104 is preferably around 0.5 mm. The first tapered section 104 tapers at a taper angle 122 from a facet width 124 of the first tapered section 104 (at the first end 116 of the first tapered section 104) to the ridge width 112 (at the second end 118 of the first tapered section 104). The facet width 124 of the first tapered section 104 is preferably around 20 μm, and the taper angle 122 of the first tapered section 104 is preferably around 0.7 degrees. In any event, the taper angle 122 of the first tapered section 104 is smaller than the delineation angle, $\Omega_d$, given by Equation 1 above.

The second tapered section 106 has a first end 126 and a second end 128. The first end 126 of the second tapered section 106 is connected to the second end 110 of the straight section 102. The second tapered section 106 has a length 130, and the length 130 of the second tapered section 106 is preferably around 0.5 mm. The second tapered section 106 tapers at a taper angle 132 from a facet width 134 of the second tapered section 106 (at the second end 128 of the second tapered section 106) to the ridge width 112 (at the first end 126 of the second tapered section 106). The facet width 134 of the second tapered section 106 is preferably around 20 μm, and the taper angle 132 of the second tapered section 106 is preferably around 0.7 degrees. As with the first tapered section 104, the taper angle 132 of the second tapered section 106 is smaller than the delineation angle, $\Omega_d$, given by Equation 1 above.

As noted above, some embodiments include only one tapered section, either the first tapered section 104 or the second tapered section 106. To obtain the most benefit of the invention, versions with just one tapered section should have the tapered section at the output facet. Additionally, although the recited dimensions may vary, the length of the tapered section is preferably between 5% and 50% of the total cavity length 136 (that is, the length of the straight section plus the length of the tapered section(s)).

While the present invention has been described with regards to particular embodiments, it is recognized that additional variations of the present invention may be devised without departing from the inventive concept.

INDUSTRIAL APPLICABILITY

This invention may be industrially applied to the development, manufacture, and use of quantum cascade lasers.

REFERENCES

[Ref. 1] Mariano Troccoli, Claire Gmachl, Federico Capasso, Deborah L. Sivco, and Alfred Y. Cho, "Mid-infrared (λ: 7.4 μm) quantum cascade laser amplifier for high power single-mode emission and improved beam quality," Appl. Phys. Lett. 80, 4103 (2002).

[Ref. 2] Stefan Menzel, Laurent Diehl, Christian Pflügl, Anish Goyal, Christine Wang, Antonio Sanchez, George Turner, and Federico Capasso, "Quantum cascade laser master-oscillator power-amplifier with 1.5 W output power at 300 K," Optics Express, 19, 16229 (2011).

[Ref. 3] Lars Nähle, Julia Semmel, Wolfgang Kaiser, Sven Höfling, and Alfred Forchel, "Tapered quantum cascade lasers," Appl. Phys. Lett. 91, 181122 (2007).

[Ref. 4] W. Zhang, L. Wang, L. Li, J. Liu, F.-Q. Liu, and Z. Wang, "Small-divergence singlemode emitting tapered distributed-feedback quantum cascade lasers," Electron. Lett. 46, 528 (2010).

[Ref. 5] Francois Ladouceur and John D. Love, "Silica-based buried channel waveguides and devices," Chapman & Hall, London, 1996), Chap. 14, pp. 177-191.

What is claimed is:

1. An improved quantum cascade laser, the improvement comprising a non-uniform dielectric waveguide, the dielectric waveguide comprising:
   (a) a longitudinally straight section having a first end, a second end, a ridge width, and a length; and
   (b) a longitudinally tapered section at the second end of the straight section, the tapered section having a first end and a second end, the first end of the tapered section being connected to the second end of the straight section, the tapered section having a length, the tapered section tapering at a taper angle from a facet width of the tapered section at the second end of the tapered section to the ridge width at the first end of the tapered section, the taper angle being less than a delineation angle of the dielectric waveguide; and
   (c) wherein the delineation angle being given by the equation:

$$\Omega_d = \frac{\sqrt{wt}}{4\lambda} \frac{n_{eff}^2 - n_{clad}^2}{n_{core}}$$

where w and t are the width and a thickness of the dielectric waveguide, respectively, $\lambda$ is a radiation wavelength, $n_{core}$ is a core refractive index, $n_{clad}$ is a cladding refractive index, and $n_{eff}$ is an effective refractive index of a waveguide mode.

2. The improved quantum cascade laser of claim 1, the dielectric waveguide further comprising a total cavity length defined as the length of the straight section plus the length of the tapered section, the length of the tapered section being between 5% and 50% of the total cavity length.

3. The improved quantum cascade laser of claim 1, the dielectric waveguide further comprising a total cavity area defined as an area of the straight section plus an area of the tapered section, the area of the tapered section being between 5% and 50% of the total cavity area.

* * * * *